(12) United States Patent
Cai et al.

(10) Patent No.: US 9,658,298 B2
(45) Date of Patent: May 23, 2017

(54) MONOLITHIC THREE-AXIS MAGNETIC FIELD SENSOR

(71) Applicant: MEMSIC, INC., Andover, MA (US)

(72) Inventors: Yongyao Cai, Acton, MA (US); Leyue Jiang, China (CN); Paul Zavracky, Boston, MA (US); Yang Zhao, Andover, MA (US); Shuo Gu, Andover, MA (US)

(73) Assignee: MEMSIC, INC, Andover, MA (US)

( * ) Notice: Subject to any disclaimer, the term of this patent is extended or adjusted under 35 U.S.C. 154(b) by 46 days.

(21) Appl. No.: 14/434,858

(22) PCT Filed: Oct. 10, 2013

(86) PCT No.: PCT/US2013/064286
§ 371 (c)(1),
(2) Date: Apr. 10, 2015

(87) PCT Pub. No.: WO2014/059110
PCT Pub. Date: Apr. 17, 2014

(65) Prior Publication Data
US 2015/0285873 A1    Oct. 8, 2015

Related U.S. Application Data

(60) Provisional application No. 61/713,223, filed on Oct. 12, 2012.

(51) Int. Cl.
G01R 33/02    (2006.01)
G01R 33/09    (2006.01)
G01R 33/00    (2006.01)

(52) U.S. Cl.
CPC ......... G01R 33/0206 (2013.01); G01R 33/00 (2013.01); G01R 33/0005 (2013.01); G01R 33/096 (2013.01)

(58) Field of Classification Search
CPC .............................. G01R 33/09; G01R 33/096
(Continued)

(56) References Cited

U.S. PATENT DOCUMENTS 4,503,394 A     3/1985   Kawakami et al.
7,126,330 B2 *  10/2006  Peczalski ............... B82Y 25/00
                                                   324/247
(Continued)

FOREIGN PATENT DOCUMENTS

CN          101203769        6/2008

OTHER PUBLICATIONS

English Translation of the First Office Action, Chinese Application No. 201380052975.2 dated Jan. 4, 2017.
(Continued)

*Primary Examiner* — Reena Aurora
(74) *Attorney, Agent, or Firm* — Preti Flaherty Beliveau & Pachios LLP (57) ABSTRACT

A three-axis magnetic sensor or magnetometer is provided. Two magnetic sensor Wheatstone bridges using barber pole AMR structures are fabricated on opposite sides of a bump structure formed on a substrate to provide surfaces that are at a predetermined angle with respect to the flat surface of the substrate. The bridge assembly is oriented along the Y axis and the bridges are interconnected such that Y and Z channel signals can be produced by processing of the bridge signals. The X channel signals are provided by an X axis sensor provided on the level surface of the substrate.

14 Claims, 9 Drawing Sheets

(58) Field of Classification Search
USPC .......................................................... 324/252
See application file for complete search history.

(56) References Cited

U.S. PATENT DOCUMENTS

| | | |
|---|---|---|
| 7,271,586 B2 | 9/2007 | Bohlinger et al. |
| 7,982,461 B2 | 7/2011 | Aiso |
| 2006/0176142 A1 | 8/2006 | Naito et al. |
| 2007/0074907 A1* | 4/2007 | Weekamp .............. G01R 33/09 |
| | | 174/525 |
| 2008/0316654 A1 | 12/2008 | Aiso |
| 2009/0015251 A1 | 1/2009 | Azumi et al. |
| 2009/0102475 A1 | 4/2009 | Rieger et al. |
| 2009/0237074 A1 | 9/2009 | Kou et al. |
| 2011/0227569 A1 | 9/2011 | Cai et al. |

OTHER PUBLICATIONS

English Transition of Taiwan Office Action, Application No. 102136893 dated Feb. 7, 2017.

* cited by examiner

MONOLITHIC THREE-AXIS MAGNETIC FIELD SENSOR

BACKGROUND OF THE INVENTION

Multi-axis magnetic sensors or magnetometers, such as three-axis magnetic sensors, are particularly desirable for modern electronic compass applications. Known magnetoresistive (MR) sensors, such as AMR (anisotropic MR) sensors, GMR (giant MR) sensors, TGMR (tunneling GMR) sensors, and the like, however, can only detect magnetic flux that is parallel to the device plane and cannot detect flux that is perpendicular to the device plane. On the other hand, Hall-effect sensors can sense magnetic flux that is perpendicular to the device plane, i.e., along the Z axis, but cannot sense magnetic flux parallel to the device plane, i.e., in the XY plane. Thus complex geometric arrangements of these sensors are required in order to measure all three axes in a single device.

One of the most common types of magnetic field sensor is the well-known magnetoresistive (MR) sensor where, generally, the resistivity of the sensor varies according to a local magnetic field oriented in the same plane as the magnetoresistance. "Barber-pole" structures are added to allow a sensing of the magnetic field along one axis to include direction, or vector, information. Magnetoresistive sensors have been used successfully in electronic compass applications, using two sensors to detect the magnetic field in the same plane as the surface they are mounted on, (X, Y), with an additional sensor mounted in a particular way so that the sensitive element is properly aligned to sense the component of the magnetic field orthogonal (Z) to the plane of the system.

There are many known approaches to fabricating a magnetic sensor with three-axis sensitivities. One approach is to package a Z axis sensor of the same technology as the X and Y axis sensors in orthogonal disposition to the two-axis XY sensors. For example, three sensors are encapsulated separately before being soldered on a PCB as a module. In this case, the orthogonal (Z) axis sensor is mounted along the axis orthogonal to the PCB directly rather than along the plane, as in, for example, U.S. Pat. No. 7,271,586. This particular orthogonal axis sensor mounting, however, can be technically challenging, and significantly increases the cost of manufacturing, as well as results in an increase in the thickness of the final product.

Another approach uses two types of sensor technologies that are disposed on a common die with one constructed to sense vertical magnetic flux signals and the other constructed to sense horizontal magnetic flux signals.

Multi-axis sensitivities can also be achieved by building sensors on a sloped surface. For example, U.S. Pat. No. 7,126,330 describes a device where two magnetic field sensing devices are provided on a first surface to detect co-planar orthogonal X, Y axes and a third magnetic field sensing unit is disposed in a trench that is created in the first surface in order to detect the magnetic field in the Z axis. The '330 patent, however, is limited by the accuracy with which the inclined walls of the trench can be made so that they are at the same inclined angle.

There are disadvantages associated with each of the known approaches. For example, combining a Z axis magnetic field sensor, whose sensing direction is perpendicular to the device (XY) plane, with an X or Y axis magnetic field sensor(s) requires one or more additional packaging steps in order to install the Z axis magnetic field sensor vertically without significant angle variation. The additional packaging steps add significant cost to the whole product manufacturing process. Furthermore, variation in the positioning angle complicates signal processing since cross-talk signals from the XY plane are introduced if the Z axis magnetic field sensor in not perfectly vertical.

There is a need, therefore, for a low profile, inexpensive, but high performance, three-axis magnetic field sensor that can be produced in large volume using a simple manufacturing process.

BRIEF SUMMARY OF THE INVENTION

A three-axis magnetic sensor or magnetometer is provided. Two magnetic sensor Wheatstone bridges using barber pole AMR structures are fabricated on opposite sides of a bump structure formed on a silicon or other substrate or wafer, i.e., on surfaces that are at a predetermined angle with respect to the flat surface of the substrate. In one embodiment, the bump structure is $S_iO_2$ formed on a silicon substrate using known photolithographic techniques. Alternatively, the bump structure can be $Al_2O_3$, $Si_3N_4$, polyimide, hard baked photoresist or other materials on which the magnetic sensor can be fabricated. The slope angle of the bump structure can vary and is only limited by the photolithography process.

In one embodiment of the present invention a bridge assembly is oriented along the Y axis and the bridges are interconnected such that Y and Z channel signals can be produced by processing of the bridge signals. The X channel signals can be provided by an X axis sensor provided on the level surface of the substrate or wafer.

In another aspect of the invention, the bridge assembly can be oriented along the X axis to produce X and Z channel signals. In this case, the Y channel signals can be provided by a Y axis sensor on the level surface of the substrate or wafer.

BRIEF DESCRIPTION OF THE SEVERAL VIEWS OF THE DRAWINGS

Various aspects of at least one embodiment of the present invention are discussed below with reference to the accompanying figures. It will be appreciated that for simplicity and clarity of illustration, elements shown in the drawings have not necessarily been drawn accurately or to scale. For example, the dimensions of some of the elements may be exaggerated relative to other elements for clarity or several physical components may be included in one functional block or element. Further, where considered appropriate, reference numerals may be repeated among the drawings to indicate corresponding or analogous elements. For purposes of clarity, not every component may be labeled in every drawing. The figures are provided for the purposes of illustration and explanation and are not intended as a definition of the limits of the invention. In the figures.

DETAILED DESCRIPTION OF THE INVENTION

In the following detailed description, numerous specific details are set forth in order to provide a thorough understanding of the embodiments of the present invention. It will be understood by those of ordinary skill in the art that these embodiments of the present invention may be practiced without some of these specific details. In other instances, well-known methods, procedures, components and structures may not have been described in detail so as not to obscure the embodiments of the present invention.

Prior to explaining at least one embodiment of the present invention in detail, it is to be understood that the invention is not limited in its application to the details of construction and the arrangement of the components set forth in the following description or illustrated in the drawings. The invention is capable of other embodiments or of being practiced or carried out in various ways. Also, it is to be understood that the phraseology and terminology employed herein are for the purpose of description and should not be regarded as limiting.

It is appreciated that certain features of the invention, which are, for clarity, described in the context of separate embodiments, may also be provided in combination in a single embodiment. Conversely, various features of the invention, which are, for brevity, described in the context of a single embodiment, may also be provided separately or in any suitable sub-combination.

Figure 1A:
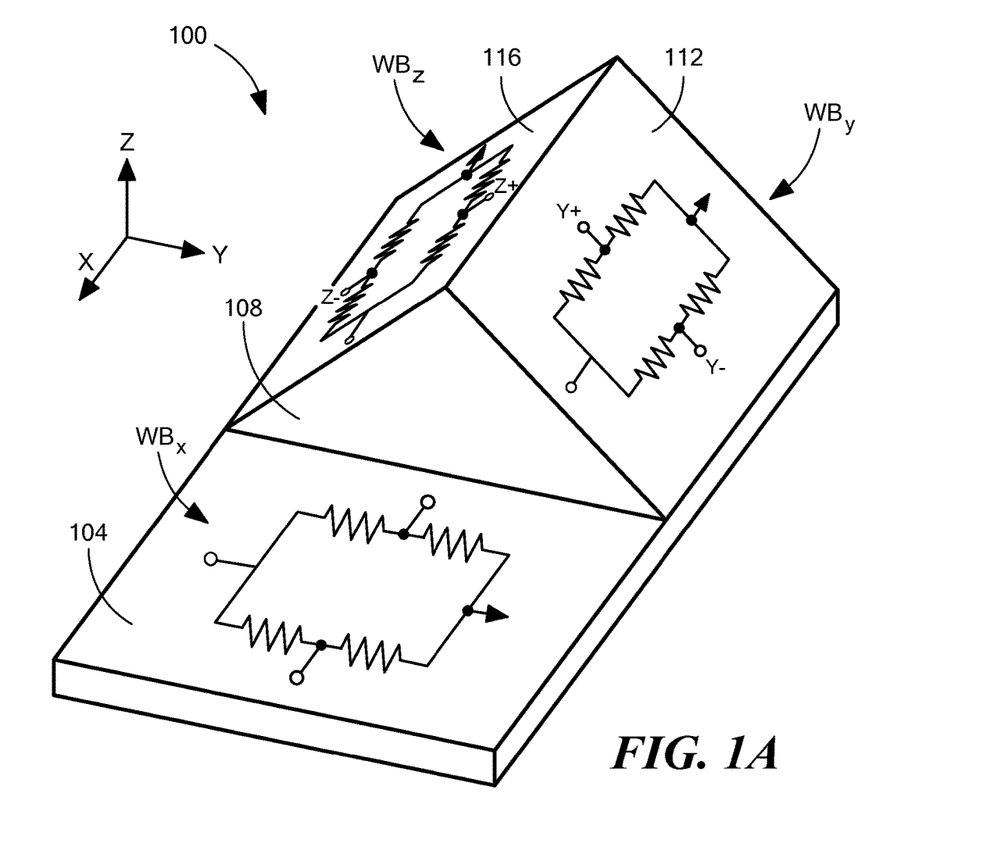
FIGS. 1A and 1B are schematic diagrams of a conceptual rendering of an embodiment of the present invention.

Generally, and as an overview, referring now to FIG. 1A, a three-axis magnetometer 100 includes a flat substrate 104, for example, a silicon substrate. A bump 108 is created on the surface 104 by operation of any of the known wafer processes, for example, photolithography, where the substrate 104 is first covered with $SiO_2$ and then photoresist is spun and patterned on the $SiO_2$ covered substrate 104. Through a thermal reflow step, a photoresist sidewall becomes rounded up. A subsequent dry etch process will remove the photoresist as well as the $SiO_2$ at the same time. As a result, a pattern and sidewall profile will be transferred to the $SiO_2$. The bump structure 108 can be made of $SiO_2$ or other materials, including $Al_2O_3$, $Si_3N_4$, Polyimide, Hard baked photoresist, silicon, etc. The slope angle can vary, as long as it is not too steep for the photolithography process.

The bump 108 includes an Up inclined surface 112 and a Down inclined surface 116. The use of "Up" and "Down" is merely for explanatory purposes to provide labels for the two surfaces 112, 116 to aid in explaining the invention. A first Wheatstone bridge WBy is provided on the Up surface 112 and a second Wheatstone bridge WBz is provided on the Down surface 116. A third Wheatstone bridge WBx is provided on the flat substrate 104. Each of these bridges comprises barber pole (BBP) resistors as is known in the art.

Figure 1B:
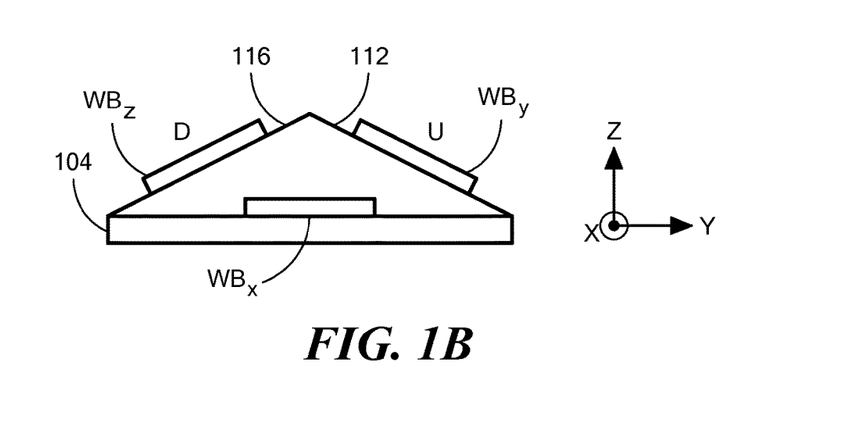

As a convention, WBx is oriented to detect a magnetic field along an X axis, as shown. The Z axis is defined as being perpendicular to the flat surface 104, as shown in FIG. 1B, which is a side view of FIG. 1A, while the Y axis is co-planar with the X axis but perpendicular thereto. As can be seen from FIG. 1B, therefore, the two bridges WBy and WBz on the sloped surfaces 112, 116 will detect a magnetic field that has components from each of the Y and Z axes. As the slope angles are the same, and as will be described below in more detail, the signals coming from the two bridges WBy, WBz can be processed to obtain the values in the respective Y and Z axis. The arrangement of the two bridge WBy and WBz may be referred to as a Y/Z detector herein.

Figure 2A:
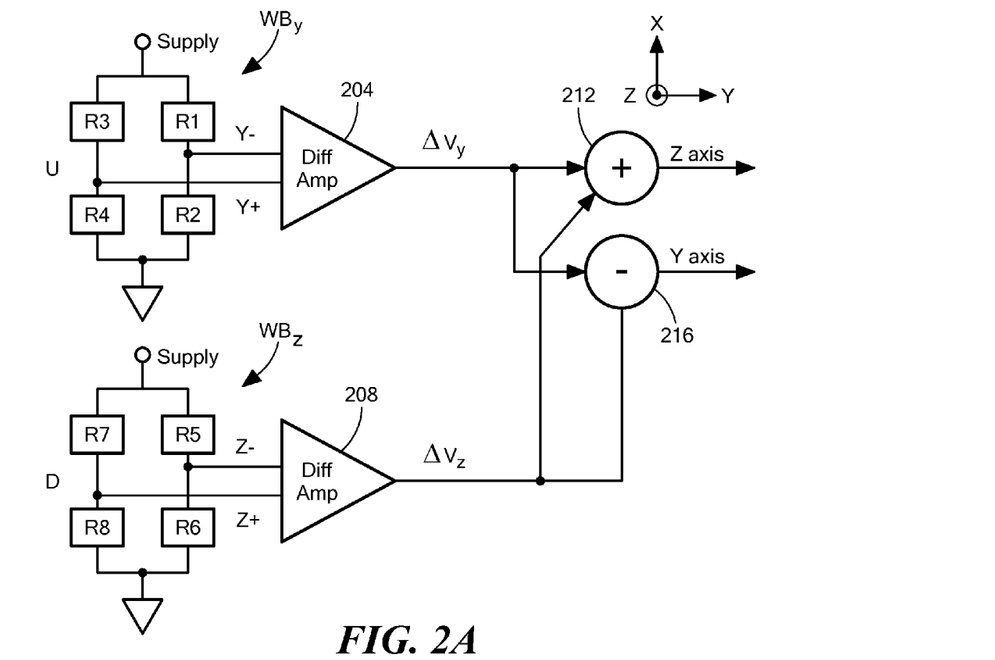
FIGS. 2A and 2B are circuit schematic diagrams of an embodiment of the present invention.
Figure 2B:
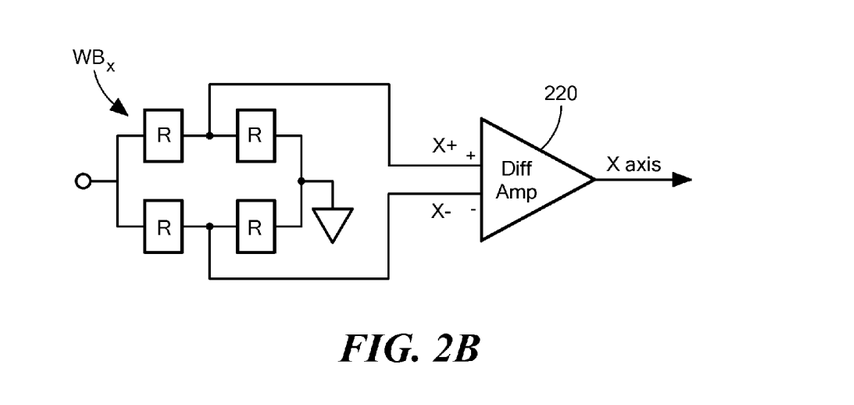

Referring now to FIG. 2A, the bridge WBy comprises four BBP resistors R1-R4 arranged in the known Wheatstone bridge configuration. Two signals Y+, Y− represent the taps used to determine the magnetic field strength along the axis coplanar and perpendicular to the resistors R1-R4. As the bridge WBy is at an angle on the Up surface 112 the magnetic field measured by the bridge WBy will have components of the Y and Z axes. Similarly, the bridge WBz comprises four BBP resistors R5-R8 also arranged in the known Wheatstone bridge configuration. Two signals Z+, Z− represent the taps used to determine the magnetic field strength along the axis coplanar and perpendicular to the resistors R5-R8. As the bridge WBz is at an angle on the Down surface 116 the magnetic field measured by the bridge WBz will also have components of the Y and Z axes although the taps on the bridge WBz are arranged to indicate the Y axis component opposite to that of the bridge WBy.

The X and Y axes, in FIG. 2A, are in the plane of the drawing while the Z axis is coming up out of the drawing plane as represented by the dot at the intersection of the X and Y axes.

In operation, a first differential amplifier 204 is used to determine a difference $\Delta Vy$ between Y+ and Y− as indicative of the magnetic field detected by WBy and a second differential amplifier 208 determines a difference $\Delta Vz$ between Z+ and Z− as indicative of the magnetic field detected by WBz. In order to determine the magnetic field Vz along the Z axis, $\Delta Vz$ and $\Delta Vy$ are added together by operation of a first adder 212 to "cancel out" the opposite Y axis components in each of the signals $\Delta Vz$ and $\Delta Vy$. The magnetic field Vy along the Y axis is determined by subtracting $\Delta Vz$ from $\Delta Vy$ using a subtractor 216 to "cancel out" the Z axis component.

As shown in FIG. 2A, the bridge WBx operates according to known principles and a third differential amplifier 220 determines Vx by taking the difference between X+ and X−.

Figure 3A:
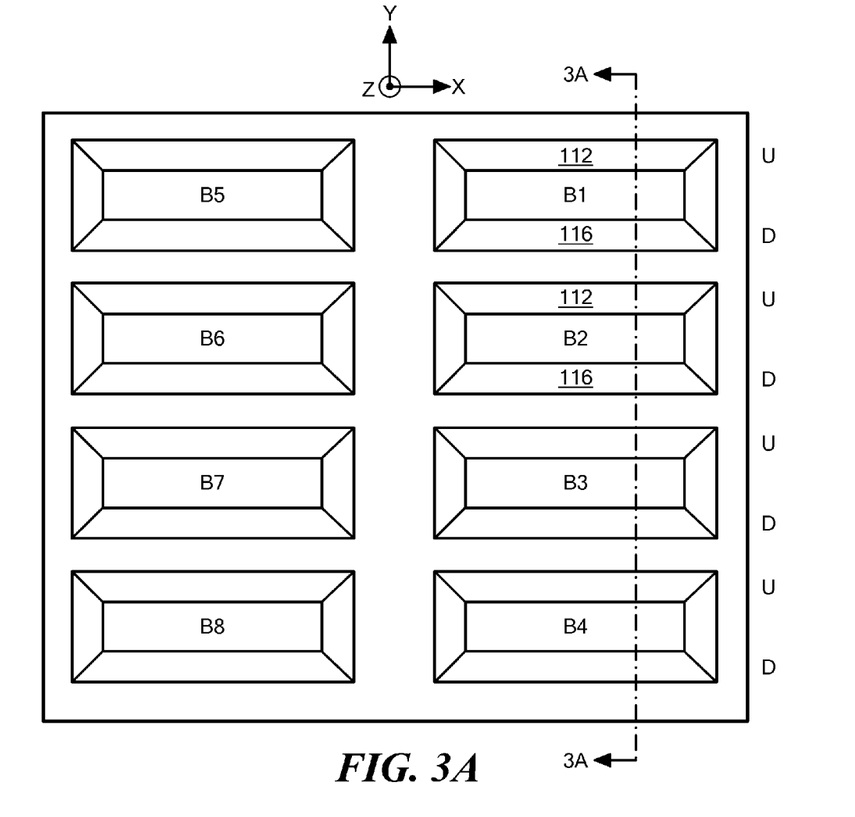
FIGS. 3A and 3B are schematic diagrams of a layout of an embodiment of the present invention.
Figure 3B:
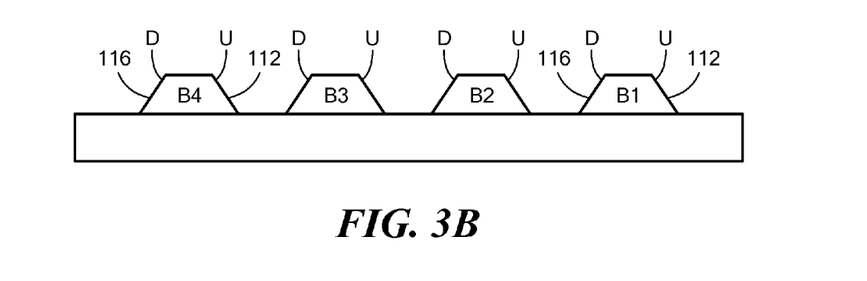

In an embodiment of the present invention, a plurality of bumps B1-B8 are provided as shown in FIGS. 3A and 3B. Each bump B1-B8 comprises an Up and Down surface 112, 116 as defined above. This is shown from the direction 3A-3A in FIG. 3B. As will be described below, the bridges WBy and WBz are distributed across the bumps B1-B8 in order to detect the magnetic field along the Y, Z axes.

Figure 4:
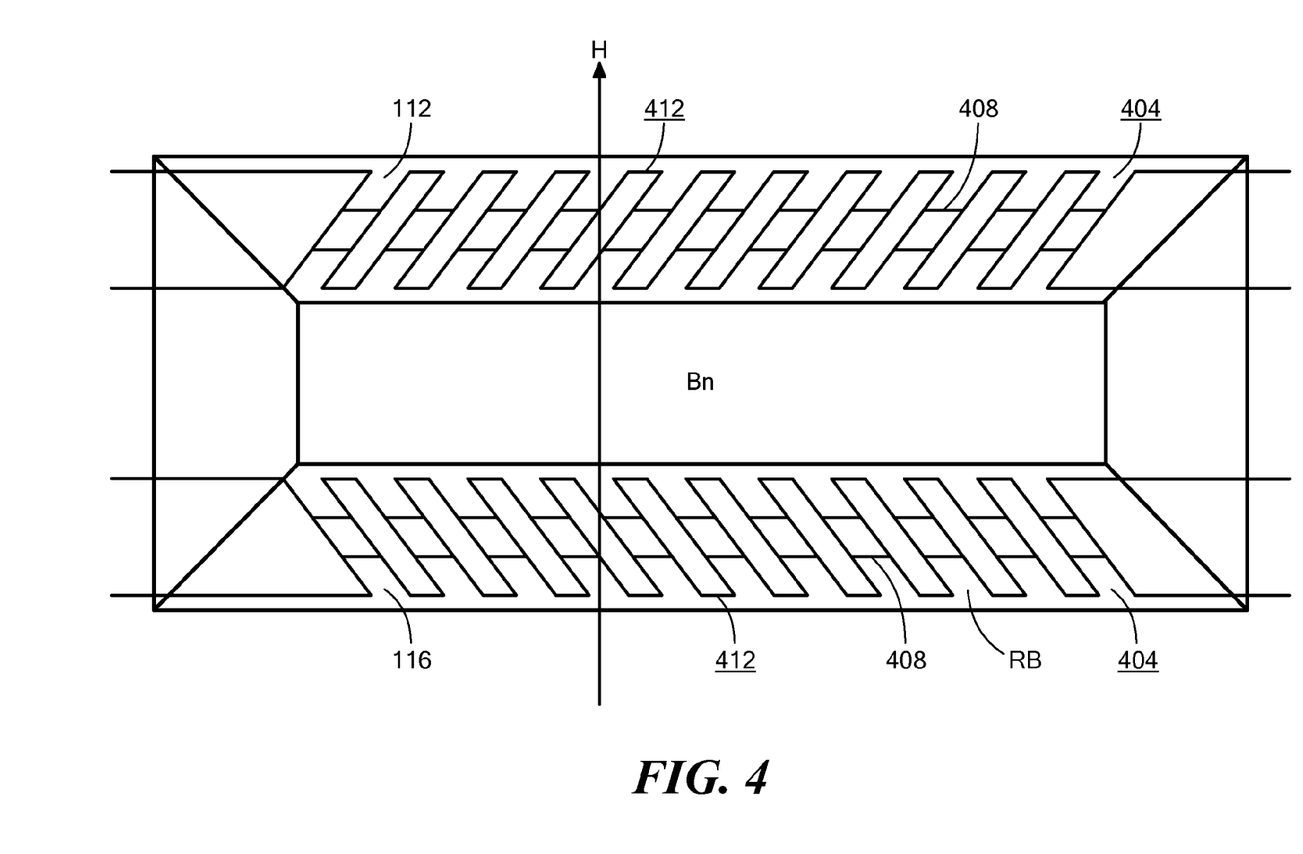
FIG. 4 is a schematic diagram of a barber pole AMR component provided on a bump structure in accordance with an embodiment of the present invention.

As has been discussed above, each resistor R1-R8 in the bridges WBy and WBz comprises a BBP structure 404. These BBP structures 404, comprising include an AMR material strip 408 and conductive straps 412, are arranged on the Up and Down surfaces 112, 116 as shown in FIG. 4. A good description of AMR-type sensor units can be found in U.S. Pat. No. 7,126,330 discussed above. As a convention followed in this specification, the BBP structure 404 on the Up surface 112 is referred to as a Forward BBP, i.e., the conductive straps are in the //////// direction, while the BBP structure 404 on the Down surface 116 is referred to as a Back BBP as the conductive straps are in the \\\\\\\\ direction, each with respect to the magnetic field H represented by the arrow H.

Figure 5A:
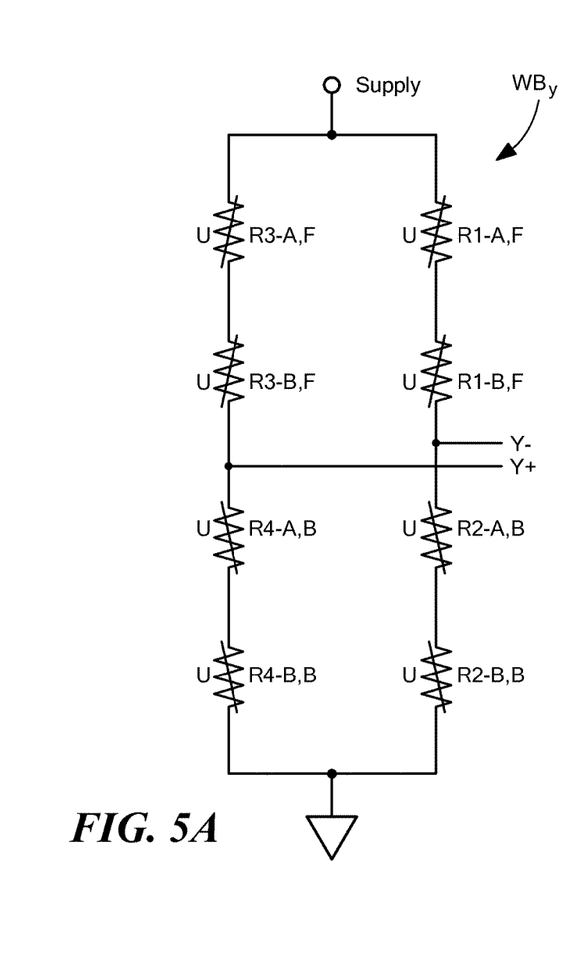
FIGS. 5A and 5B are circuit schematic diagrams in accordance with an embodiment of the present invention.
Figure 5B:
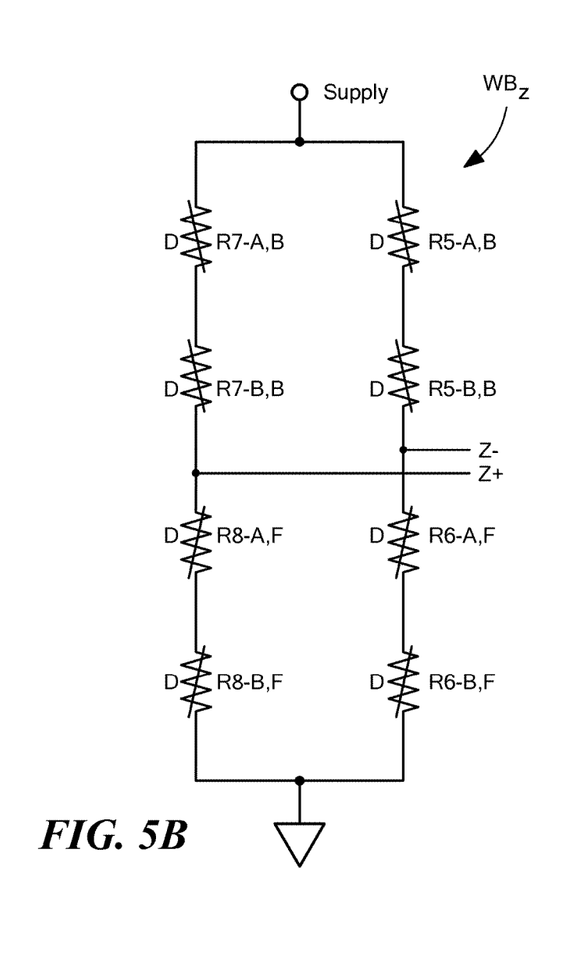

As there are eight bumps B1-B8, each of the eight resistors R1-R8 of the two bridges WBy, WBz is divided into an A and B resistive element as schematically shown in FIGS. 5A and 5B.

As above, the resistors R1-R4 of bridge WBy are distributed on the Up surfaces 112 of bumps B1-B8 where resistors R1-A, R1-B, R3-A and R3-B are forward BBPs and the resistors R2-A, R2-B, R4-A and R4-B are back BBPs. The resistors R5-R8 of bridge WBz are distributed on the Down surfaces 116 of bumps B1-B8 where resistors R5-A, R5-B, R7-A and R7-B are back BBPs and the resistors R6-A, R6-B, R8-A and R8-B are forward BBPs.

Figure 6:
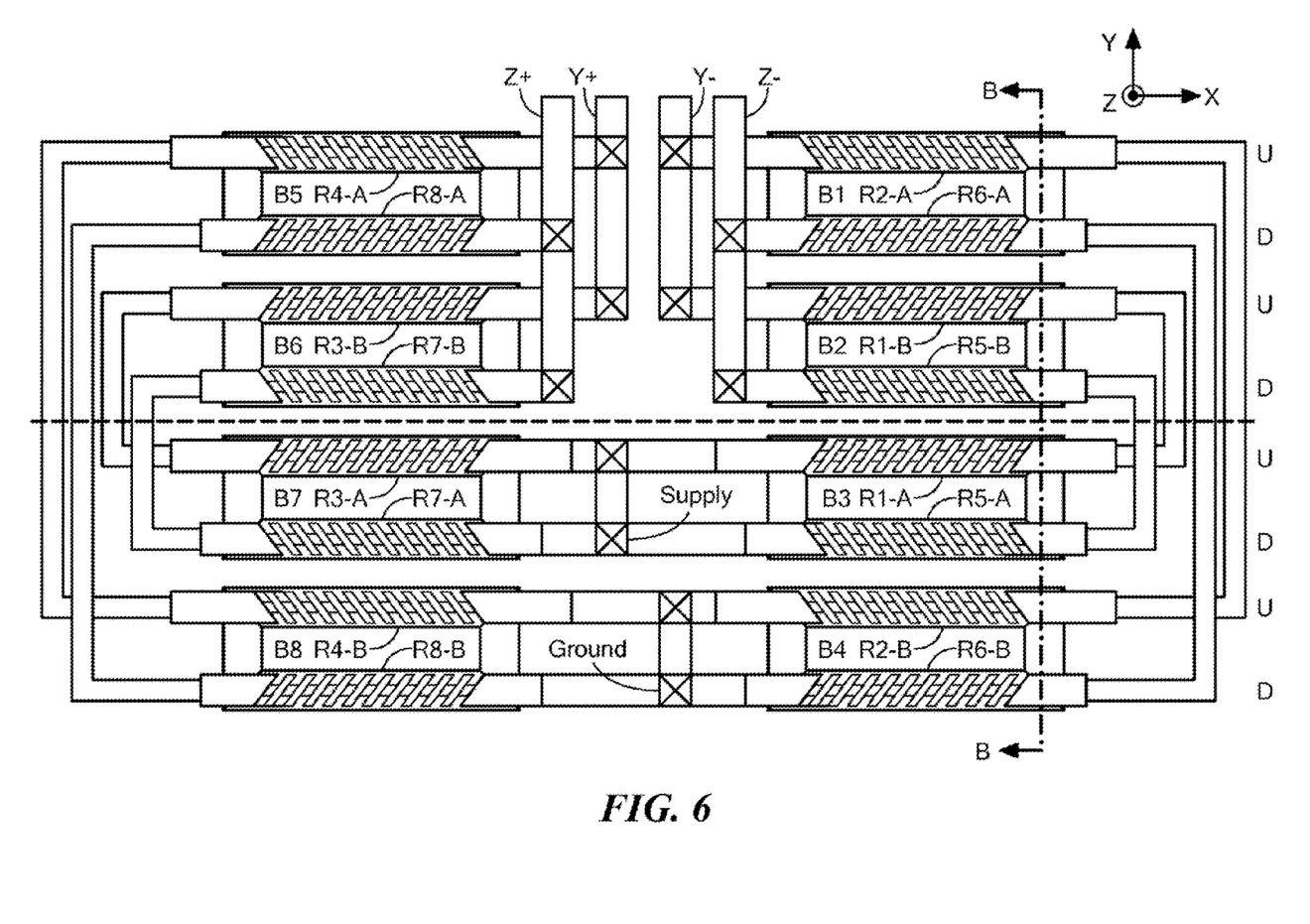
FIG. 6 is a schematic diagram of a physical layout of an embodiment of the present invention.

Referring to FIG. 6, the resistive elements R1-A, R1-B, . . . R8-A and R8-B are distributed across the bumps B1-B8. Advantageously, any process deviations or slight differences in the angles of the sloped surfaces of the bumps will be averaged out by the interdigitation of the resistive elements of the two bridges WBy and WBz.

Figure 7:
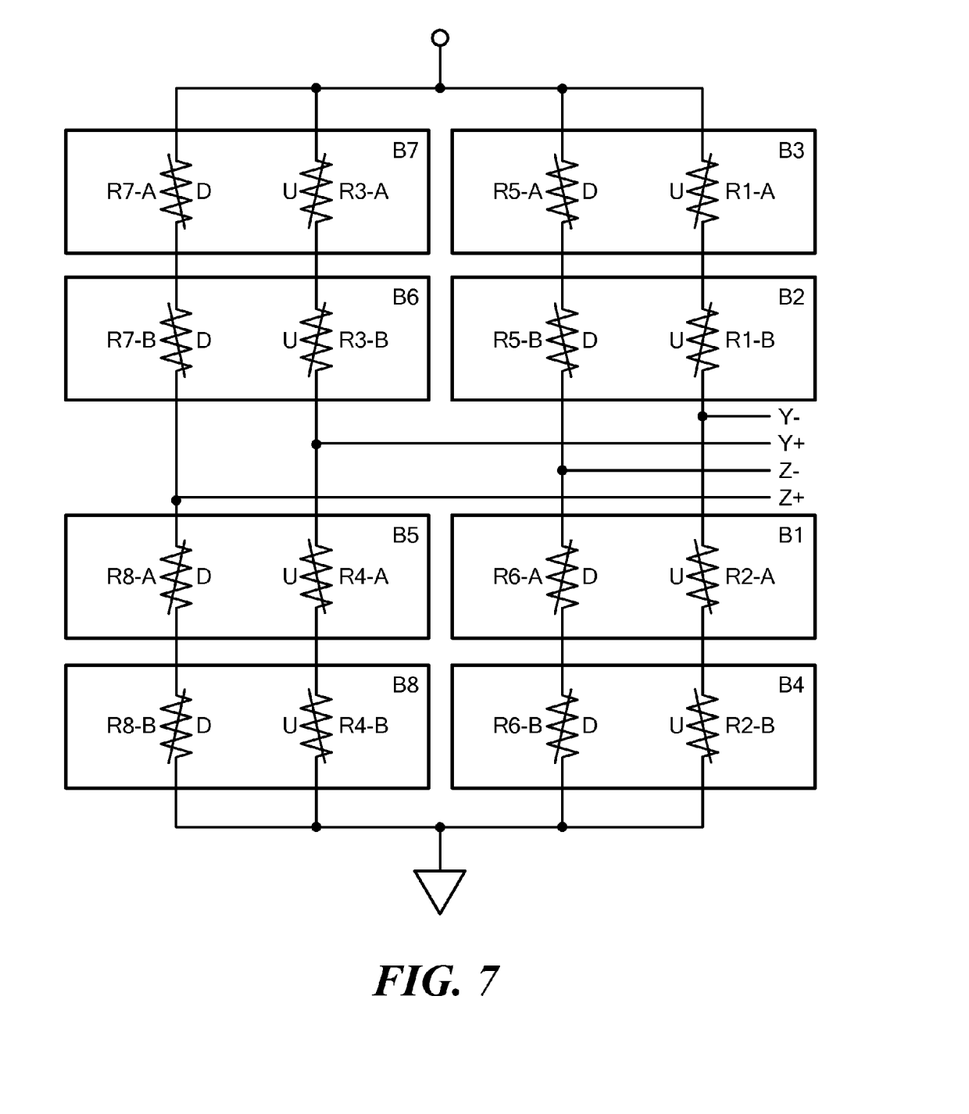
FIG. 7 is a circuit schematic diagram in accordance with an embodiment of the present invention.

An electrical schematic of the two bridges WBy, WBz and the respective bumps B1-B8 is presented in FIG. 7. As shown, the two bridges are interdigitated with one another by positioning corresponding resistors on opposite faces of the same bump. As an example, bump B3 includes forward resistor element R1-A on the Up surface 112 with back resistor element R5-A on the Down surface 116 of the bump B3.

In the foregoing embodiment, the Y/Z detector is used in conjunction with an X axis detector to obtain magnetic field measurements in all three axes using an integrated device. In an alternate embodiment, the X axis detector is replaced with two additional Wheatstone bridges on a second set of bumps that is oriented orthogonal to the bumps that make up the Y/Z detector.

Figure 8:
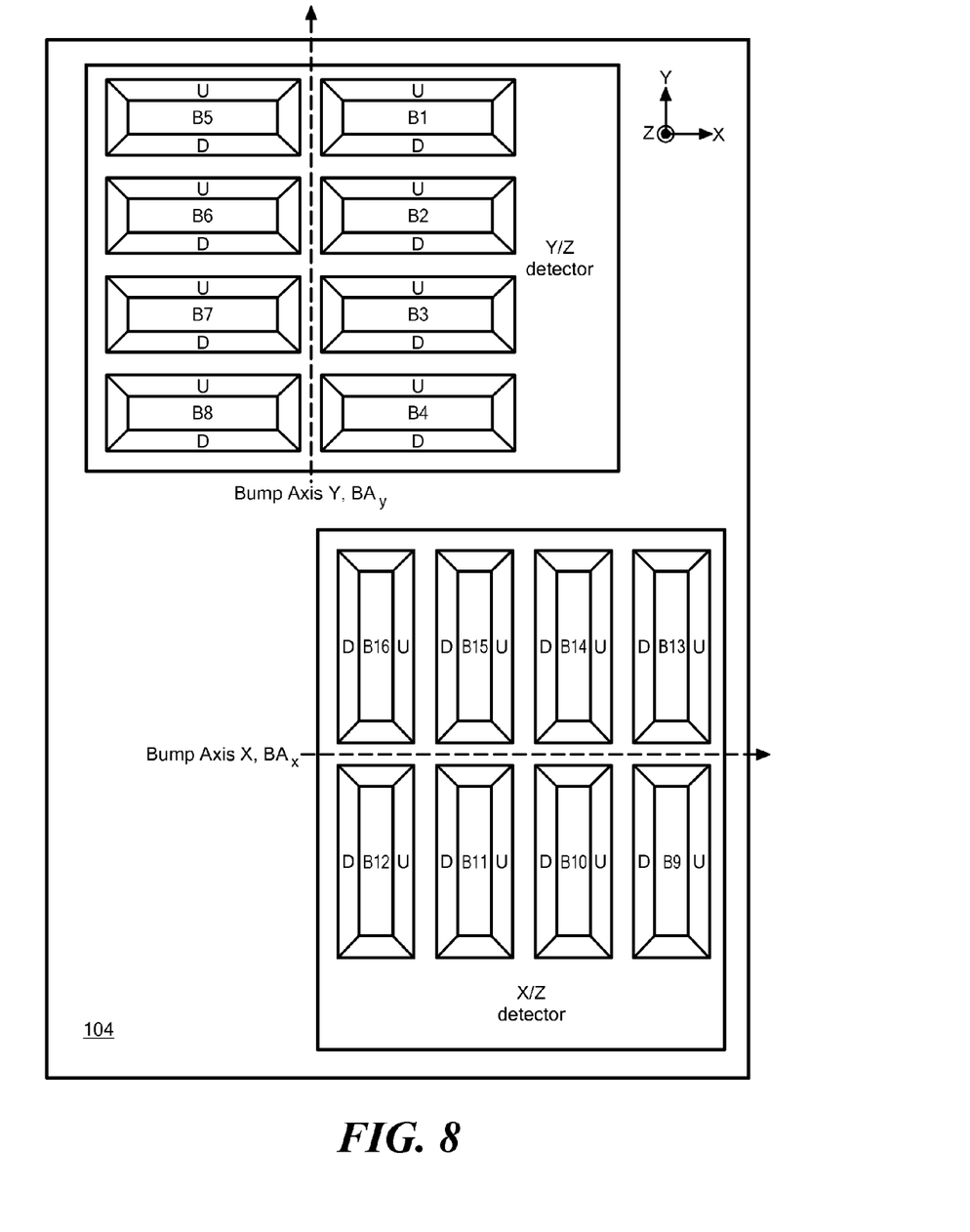
FIG. 8 is a schematic diagram of a layout of an embodiment of the present invention.

Thus, as shown in FIG. 8, an X/Z detector having the same construction as the Y/Z detector above is provided in the substrate and orthogonal to the Y/Z detector. As shown, the X/Z detector includes bumps B9-B16 with corresponding Up and Down surfaces and BBP resistor elements constructed the same as the Y/Z detector already described. Thus, a bump axis Bay of the Up/Down surfaces of bumps B1-B8 is aligned with the Y axis while a bump axis BAx of the bumps B9-B16 is aligned with the X axis. Two Wheatstone bridges WBx and WBz1 are provided thereon and sense magnetic fields in the X and Z axes, respectively.

Figure 9:
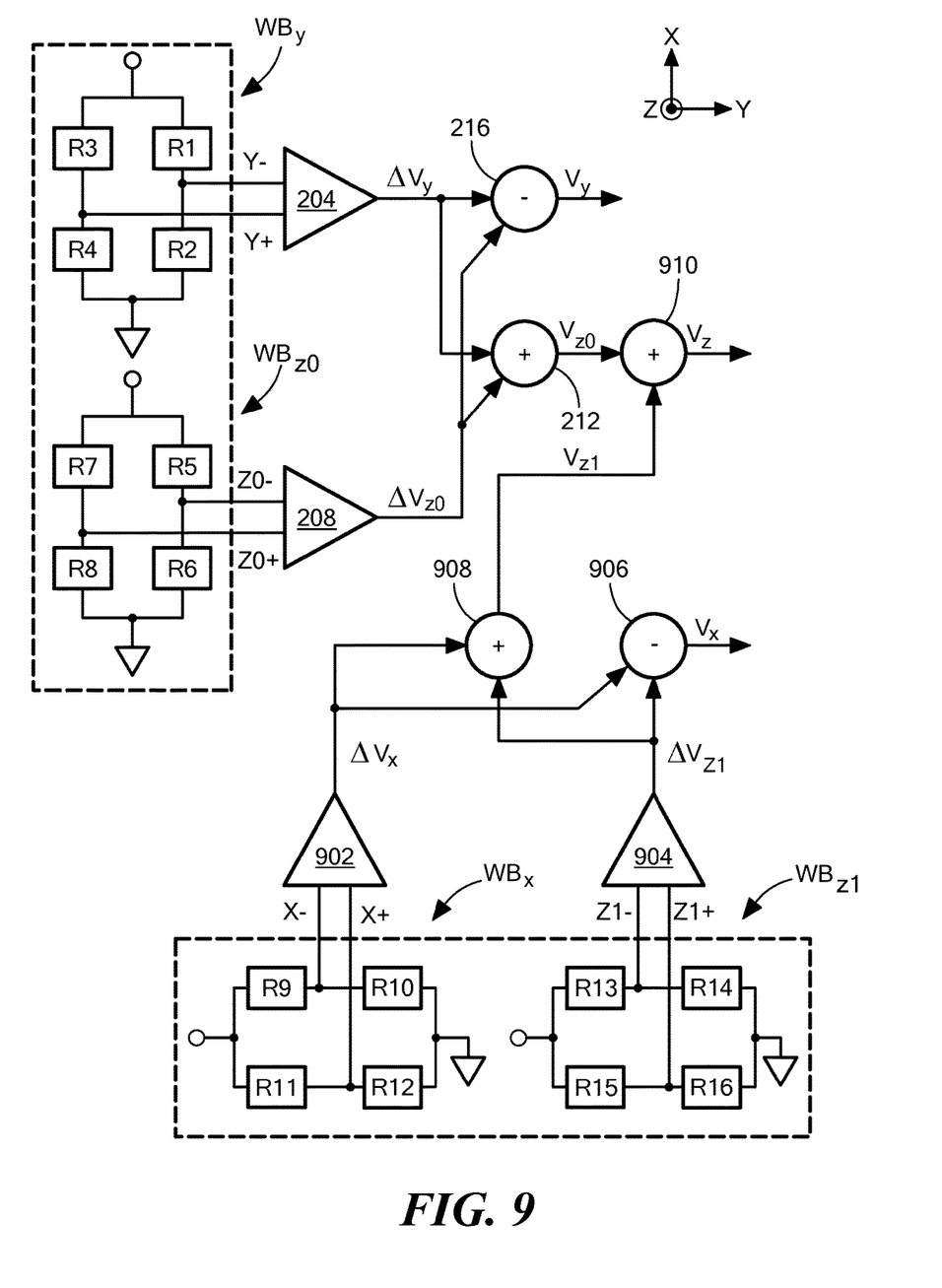
FIG. 9 is a circuit schematic diagram in accordance with the embodiment of the present invention shown in FIG. 8.

In operation, referring to the schematic in FIG. 9, the measurement of the field along the Y axis is obtained as was previously described. Similarly, the measurement along the X axis is obtained by taking the difference between ΔVz1 and ΔVx by operation of subtractor 906.

Advantageously, a more accurate measurement of the magnetic field along the Y axis is obtained by summing together ΔVz0, ΔVy, ΔVz1 and ΔVx by adders 212, 908 and 910 such that the opposing measurements in the X axis cancel out each other, as do the opposing measurements in the Y axis therefore leaving only the measurements due to the magnetic field in the Z axis.

The BBP structures 404 may be provided on the UP and Down sloped surfaces 112, 116 by known photolithography deposition processes. Accordingly, the angle of the bump slopes will affect the deposition process resulting in the AMR strip and conductive straps being slightly thicker on the upper portion of the slope relative to the deposition on the lower portion of the slope. It has been determined that this slight difference in thickness provides a functional advantage although certainly the deposition process could also be configured to deposit the bridges to have a consistent thickness on all portions of the slopes.

It should be noted that the number of bumps could be chosen to be greater than eight and one of ordinary skill in the art would understand how to distribute the bridge resistor elements across the bumps.

In addition, while the bumps are shown as having a flat surface between the Up and Down surfaces, 112, 116, i.e., a trapezoidal cross-section, the bumps could be more triangular in cross-section and come to a point rather than have a flat section at the top. Thus, a "bump" is a structure that provides a pair of adjacent, symmetric inclined surfaces.

Further, the differential amplifiers, adders and subtractors may be incorporated or integrated into the substrate or provided "off" the substrate. In addition, the functions of the differential amplifiers, the adders and subtractors may be implemented within, for example, an ASIC in a digital, analog or hybrid implementations and such implementations are considered to be within the scope of this disclosure.

Having thus described several features of at least one embodiment of the present invention, it is to be appreciated that various alterations, modifications, and improvements will readily occur to those skilled in the art. Such alterations, modifications, and improvements are intended to be part of this disclosure and are intended to be within the scope of the invention. Accordingly, the foregoing description and drawings are by way of example only, and the scope of the invention should be determined from proper construction of the appended claims, and their equivalents.

What is claimed is:

1. A magnetometer comprising:
   a substrate having a first surface;
   a first plurality of bumps disposed on the first surface of the substrate, each bump comprising first and second inclined surfaces with respect to the substrate first surface;
   a first Wheatstone bridge circuit disposed across the first inclined surfaces of the bumps of the first plurality; and
   a second Wheatstone bridge circuit disposed across the second inclined surfaces of the bumps of the first plurality,
   wherein the bumps in the first plurality of bumps are aligned with a same first axis, and
   wherein each bump in the first plurality of bumps comprises a first resistive element from the first Wheatstone bridge circuit on the corresponding first inclined surface and a first resistive element from the second Wheatstone bridge circuit on the corresponding second inclined surface and the first resistive element in the first Wheatstone bridge circuit corresponds to the first resistive element in the second Wheatstone bridge circuit.

2. The magnetometer of claim 1, further comprising:
   a second plurality of bumps disposed on the first surface of the substrate, each bump comprising first and second inclined surfaces with respect to the substrate first surface;
   a third Wheatstone bridge circuit disposed across the first inclined surfaces of the bumps of the second plurality; and
   a fourth Wheatstone bridge circuit disposed across the second inclined surfaces of the bumps of the second plurality,
   wherein the bumps in the second plurality of bumps are aligned with a same second axis, and
   wherein the second axis is orthogonal to the first axis.

3. The magnetometer of claim 2, wherein each of the third and fourth Wheatstone bridge circuits comprises a plurality of anisotropic magnetoresistive (AMR) components.

4. The magnetometer of claim 3, where each bump in the second plurality of bumps comprises an AMR component from the third Wheatstone bridge circuit on the corresponding first inclined surface and an AMR component from the fourth Wheatstone bridge circuit on the corresponding second inclined surface.

5. The magnetometer of claim 2, wherein the first and second inclined surfaces of the second plurality of bumps are at a same second angle with respect to the substrate first surface.

6. The magnetometer of claim 1, wherein each of the first and second Wheatstone bridge circuits comprises a plurality of anisotropic magnetoresistive (AMR) components.

7. The magnetometer of claim 1, wherein the first and second inclined surfaces of the first plurality of bumps are at a same first angle with respect to the substrate first surface.

8. The magnetometer of claim 1, wherein each bump comprises a trapezoidal cross-section.

9. The magnetometer of claim 1, wherein each bump comprises a triangular cross-section.

10. The magnetometer of claim 1, wherein:
the first and second inclined surfaces of the first plurality of bumps are at a same first angle with respect to the substrate first surface,
wherein the first and second inclined surfaces of the second plurality of bumps are at a same second angle with respect to the substrate first surface, and
wherein the first and second angles are the same.

11. The magnetometer of claim 1, further comprising:
a planar Wheatstone bridge circuit disposed on the first surface of the substrate oriented along an axis that is orthogonal to the first axis.

12. A three-axis magnetometer comprising:
a substrate having a first surface;
a first Wheatstone bridge circuit disposed on the substrate, wherein the first Wheatstone bridge circuit comprises a first plurality of anisotropic magnetoresistive (AMR) components and wherein each of the first plurality of AMR components is disposed at a first angle with respect to the first surface;
a second Wheatstone bridge circuit disposed on the substrate, wherein the second Wheatstone bridge circuit comprises a second plurality of AMR components and wherein each of the second plurality of AMR components is disposed at a second angle with respect to the first surface; and
a third Wheatstone bridge circuit disposed on the first surface of the substrate,
wherein the first and second angles are equal and symmetric to one another,
wherein the three-axis magnetometer further comprises:
a first plurality of bumps disposed on the first surface of the substrate, each bump comprising first and second inclined surfaces disposed at the first and second angles, respectively, with respect to the substrate first surface;
wherein the AMR components of the first Wheatstone bridge circuit are disposed across the first inclined surfaces of the first plurality of bumps,
wherein the AMR components of the second Wheatstone bridge circuit are disposed across the second inclined surfaces of the first plurality of bumps,
wherein the bumps in the first plurality of bumps are aligned with a same first axis,
wherein each bump in the first plurality of bumps comprises a first AMR component from the first Wheatstone bridge circuit on the corresponding first inclined surface and a first AMR component from the second Wheatstone bridge circuit on the corresponding second inclined surface and the first AMR component in the first Wheatstone bridge circuit corresponds to the first AMR component in the second Wheatstone bridge circuit, and
wherein the third Wheatstone bridge is aligned with a second axis orthogonal to the first axis.

13. A three-axis magnetometer comprising:
a substrate having a first surface;
a first Wheatstone bridge circuit disposed on the substrate, wherein the first Wheatstone bridge circuit comprises a first plurality of anisotropic magnetoresistive (AMR) components and wherein each of the first plurality of AMR components is disposed at a first angle with respect to the first surface;
a second Wheatstone bridge circuit disposed on the substrate, wherein the second Wheatstone bridge circuit comprises a second plurality of AMR components and wherein each of the second plurality of AMR components is disposed at a second angle with respect to the first surface;
a third Wheatstone bridge circuit disposed on the substrate, wherein the third Wheatstone bridge circuit comprises a third plurality of anisotropic magnetoresistive (AMR) components and wherein each of the third plurality of AMR components is disposed at a third angle with respect to the first surface; and
a fourth Wheatstone bridge circuit disposed on the substrate, wherein the fourth Wheatstone bridge circuit comprises a fourth plurality of AMR components and wherein each of the fourth plurality of AMR components is disposed at a fourth angle with respect to the first surface,
wherein the first and second angles are equal and symmetric to one another, and
wherein the third and fourth angles are equal and symmetric to one another and transvers to the first and second angles.

14. The three-axis magnetometer of claim 13, further comprising:
a first plurality of bumps disposed on the first surface of the substrate, each bump comprising first and second inclined surfaces disposed at the first and second angles, respectively, with respect to the substrate first surface;
a second plurality of bumps disposed on the first surface of the substrate, each bump comprising third and fourth inclined surfaces disposed at the third and fourth angles, respectively, with respect to the substrate first surface;
wherein the AMR components of the first Wheatstone bridge circuit are disposed across the first inclined surfaces of the first plurality of bumps,
wherein the AMR components of the second Wheatstone bridge circuit are disposed across the second inclined surfaces of the first plurality of bumps,
wherein the AMR components of the third Wheatstone bridge circuit are disposed across the third inclined surfaces of the second plurality of bumps,
wherein the AMR components of the fourth Wheatstone bridge circuit are disposed across the fourth inclined surfaces of the second plurality of bumps,
wherein each bump in the first plurality of bumps comprises a first AMR component from the first Wheatstone bridge circuit on the corresponding first inclined surface and a first AMR component from the second Wheatstone bridge circuit on the corresponding second inclined surface and the first AMR component in the first Wheatstone bridge circuit corresponds to the first AMR component in the second Wheatstone bridge circuit, wherein each bump in the second plurality of bumps comprises a first AMR component from the third Wheatstone bridge circuit on the corresponding first inclined surface and a first AMR component from the fourth Wheatstone bridge circuit on the corresponding second inclined surface and the first AMR component in the third Wheatstone bridge circuit corresponds to the first AMR component in the fourth Wheatstone bridge circuit, wherein the bumps in the first plurality of bumps are aligned with a same first axis, and wherein the bumps in the second plurality of bumps are aligned with a same second axis, orthogonal to the first axis.

* * * * *